United States Patent
Fan

(10) Patent No.: US 9,780,833 B2
(45) Date of Patent: Oct. 3, 2017

(54) DE-EMBEDDING CABLE EFFECT FOR WAVEFORM MONITORING FOR ARBITRARY WAVEFORM AND FUNCTION GENERATOR

(71) Applicant: TEKTRONIX, INC., Beaverton, OR (US)

(72) Inventor: Zhiguang Fan, Shanghai (CN)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/010,839

(22) Filed: Jan. 29, 2016

(65) Prior Publication Data

US 2016/0226558 A1    Aug. 4, 2016

(30) Foreign Application Priority Data

Jan. 30, 2015  (CN) .......................... 2015 1 0048381

(51) Int. Cl.
| | |
|---|---|
| H04B 3/46 | (2015.01) |
| G01R 31/02 | (2006.01) |
| G01R 31/08 | (2006.01) |
| H04L 25/12 | (2006.01) |
| H04B 3/466 | (2015.01) |

(52) U.S. Cl.
CPC ............. *H04B 3/46* (2013.01); *G01R 31/021* (2013.01); *G01R 31/08* (2013.01); *H04B 3/466* (2013.01); *H04L 25/12* (2013.01)

(58) Field of Classification Search
CPC .. H04B 17/0065; H04B 17/0042; H04B 3/46; H04B 17/004; H04L 1/24; H04L 12/2602; H04L 43/00; H04L 1/20

USPC .......................... 375/228, 224, 219, 296, 316
See application file for complete search history.

(56) References Cited

U.S. PATENT DOCUMENTS

| | | | |
|---|---|---|---|
| 2004/0027138 A1* | 2/2004 | Pickerd .................. | G01R 13/22 324/646 |
| 2005/0185769 A1 | 8/2005 | Pickerd | |
| 2011/0163762 A1 | 7/2011 | Marchetti | |

OTHER PUBLICATIONS

European Search Report and Written Opinion for EP Application No. 16153456.5, dated Jun. 24, 2016, 9 pages.

\* cited by examiner

*Primary Examiner* — Zewdu Kassa
(74) *Attorney, Agent, or Firm* — Marger Johnson; Kevin Dothager

(57) ABSTRACT

A method for determining a waveform expected to be received by a device under test, the method including outputting a waveform generated by a waveform generation section of an arbitrary waveform and function generator at an output of the arbitrary waveform and function generator; sending the waveform generated by the waveform generation section to the device under test through a cable; monitoring a waveform at the output by a waveform monitoring section of the arbitrary waveform and function generator; and determining by the waveform monitoring section a transformed waveform expected to be received at the device under test based on the generated waveform being modified by the cable.

20 Claims, 4 Drawing Sheets

US 9,780,833 B2

1

DE-EMBEDDING CABLE EFFECT FOR WAVEFORM MONITORING FOR ARBITRARY WAVEFORM AND FUNCTION GENERATOR

TECHNICAL FIELD

This disclosure relates to an arbitrary waveform and function generator, more specifically, an arbitrary waveform and function generator that de-embeds the effects of a coaxial cable upon the measurement and/or monitoring of the output waveform without any knowledge of the device under test.

BACKGROUND

Arbitrary Waveform and Function Generator (AFG) instruments are widely utilized for generating continuous/burst user-defined mathematical function waveform signals for electronic circuit design and testing. Typically, an AFG instrument has an output impedance of 50 ohms over its operating frequency range. The load impedance of a device under test (DUT) impacts the actual output signal of an AFG instrument.

During a typical operation, a low insertion-loss cable is generally used to connect the AFG to a DUT. For low frequencies and matching loads, the waveform monitoring function of the AFG works well with a minor cable attenuation that is easy to compensate. However, at high frequencies, i.e., when the cable length is comparable to the signal wave length and the load impedance of a DUT is mismatched with the AFG output impedance, the measurement results in the local output point of the AFG might be quite different than the actual signals loaded to the remote point of the DUT, due to the impedance transformation of the transmission line, which will be called the cable effect hereinafter.

SUMMARY

Some embodiments of the disclosed technology include a method for determining a waveform expected to be received by a device under test, the method including outputting a waveform generated by a waveform generation section of an arbitrary waveform and function generator at an output of the arbitrary waveform and function generator; sending the waveform generated by the waveform generation section to the device under test through a cable; monitoring a waveform at the output by a waveform monitoring section of the arbitrary waveform and function generator; and determining by the waveform monitoring section a transformed waveform expected to be received at the device under test based on the generated waveform being modified by the cable.

Some embodiments of the disclosed technology include an arbitrary waveform and function generator, including a waveform generation section configured to generate a waveform at an output; and a waveform monitoring section configured to monitor the waveform at the output. The waveform monitoring section includes a waveform de-embedding processor configured to determine a transformed waveform expected to be received at the device under test based on the generated waveform being modified by the cable, and a display configured to display the transformed waveform.

DETAILED DESCRIPTION

Figure 1:
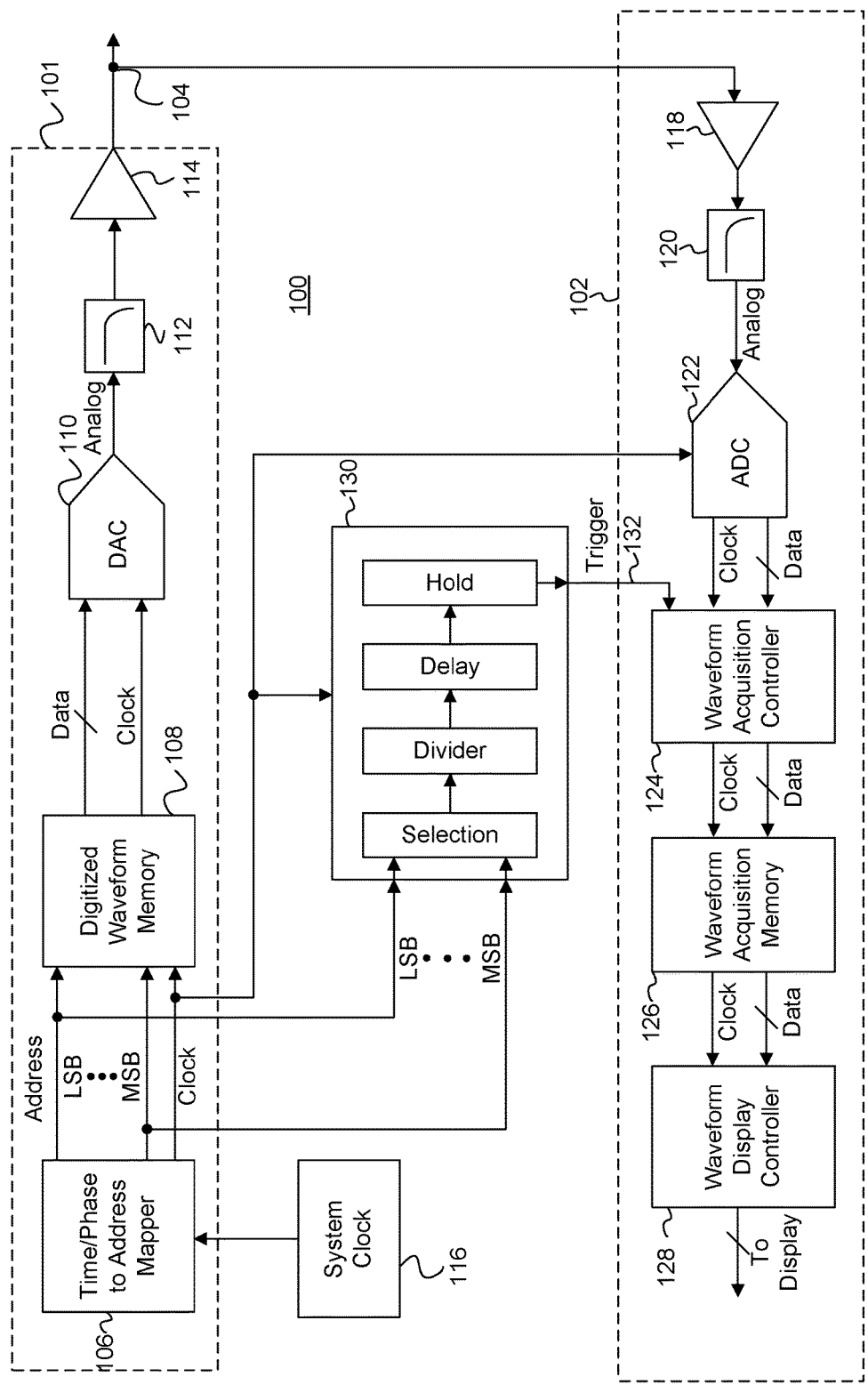
FIG. 1 illustrates a traditional arbitrary waveform and function generator.

In the drawings, which are not necessarily to scale, like or corresponding elements of the disclosed systems and methods are denoted by the same reference numerals.

FIG. 1 illustrates a typical design of an AFG 100. The AFG 100 includes a signal generation section 101 and a waveform monitoring section 102. The signal generation section 101 generates a signal to send to the DUT. The waveform monitoring section 102 monitors the signal generated by the signal generation section 101 at a local test point on the output 104 on the AFG.

In the signal generation section 101, a waveform signal, such as a sine function waveform signal or a user-defined arbitrary waveform signal, is digitized at a specific time/phase interval and a specific vertical resolution, and is saved to the Digitized Waveform Memory 108. The Time/Phase to Address Mapper 106 functions at a specific clock, received from the System Clock 116, to access the Digitized Waveform Memory 108 to output a digitized waveform at the correct time/phase intervals for achieving the user-specified signal waveform frequency.

The digitized waveform is then output from the Digitized Waveform Memory 108 to a Digital-to-Analog Converter (DAC) 110 to convert the digitized waveform to an analog signal. The analog signal is sent through a waveform reconstruction filter 112 and output to an amplifier 114 to scale the analog signal to a user-required amplitude. This analog signal is sent through the output 104 to a remote DUT location through a coaxial cable.

As mentioned above, the waveform monitoring section 102 monitors the signal generated by the signal generation section 101 at a local test point on the output 104 on the AFG.

The high impedance amplifier 118 may vary its gain/attenuation to produce an appropriate output signal amplitude. Then, an anti-aliasing filter 120 removes the high frequency noise beyond the bandwidth of the Analog-to-Digital Converter (ADC) 122. The ADC 122 converts the analog signal received to a digitized waveform. The digitized waveform is acquired by a Waveform Acquisition Controller 124 and stored in the Waveform Acquisition Memory 126. Synchronization block 130 generates a trigger signal 132 to ensure that the acquisition is accomplished in a complete signal period. The acquired digitized waveform stored in the Waveform Acquisition Memory 126 is sent to the Waveform Display Controller 128 for waveform display and/or monitoring on the AFG.

For example, using the configuration of the AFG shown in FIG. 1, a sine waveform signal is acquired at a local test point on the output 104. The acquisition starts at a 0° phase and ends at a 360° phase using a trigger 132 through a Waveform Acquisition Controller 124. The digitized acquired waveform is stored in the Waveform Acquisition Memory 126 and sent to the Waveform Display Controller 128. However, the acquired waveform may be quite different from the remote waveform at the DUT connected to the AFG through a coaxial cable, due to the cable effect. That is, the acquired waveform at the AFG test point will not depict the actual waveform received at the DUT, since this waveform has been subjected to the cable effect.

Figure 2:
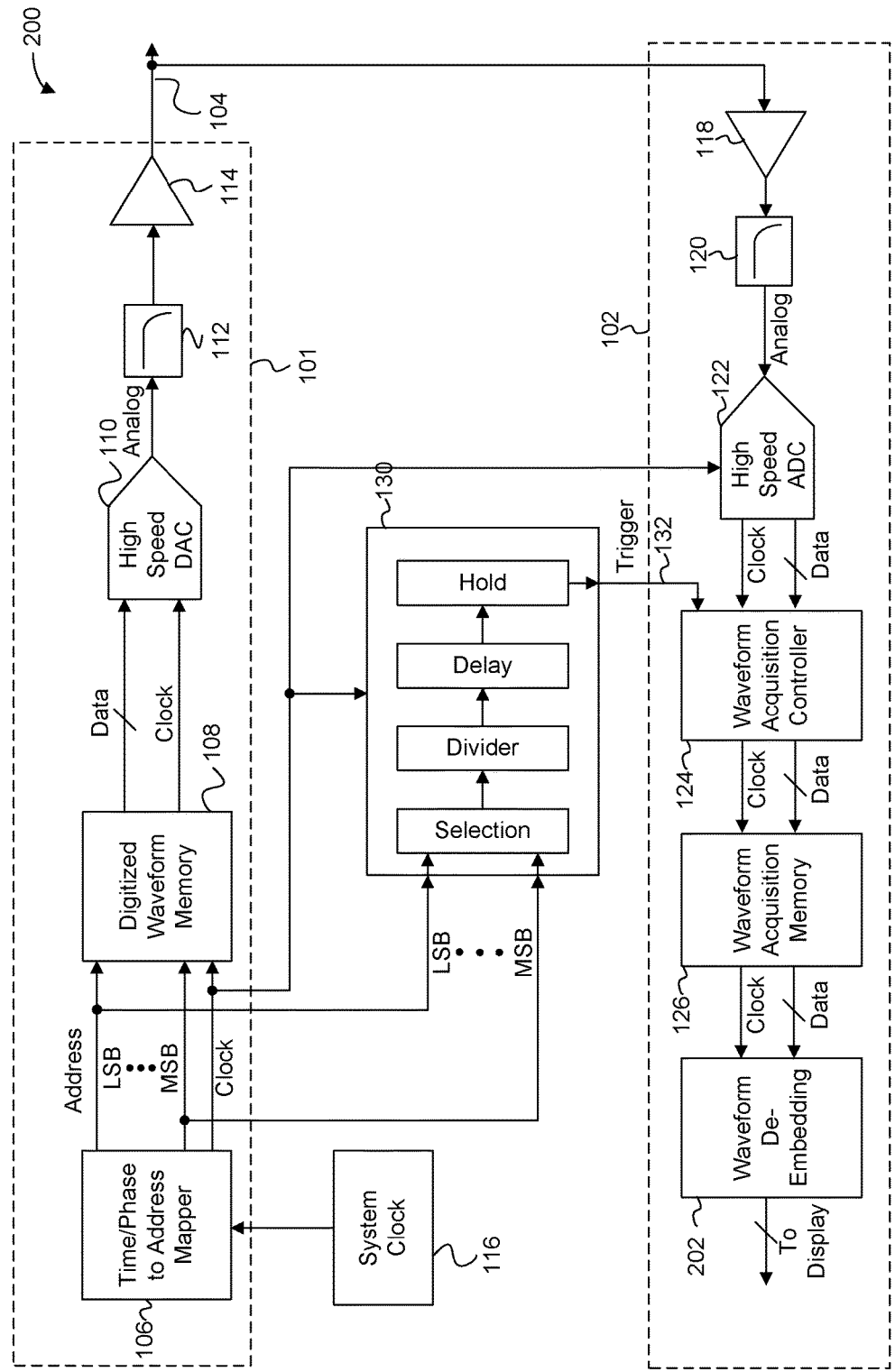
FIG. 2 illustrates an arbitrary waveform and function generator according to aspects of the disclosed technology.

According to embodiments of the present invention, as seen in FIG. 2, a Waveform De-embedding Module 202 may be used in an AFG 200. As discussed in further detail below, the Waveform De-embedding module 202 may de-embed the cable effect from the acquired waveform to retrieve the waveform actually present at the DUT for waveform display and/or monitoring.

Using the AFG 200 depicted in FIG. 2, the cable effect can be de-embedded from the monitored waveform without knowledge of the DUT. This allows the waveform monitoring and testing to virtually move to the DUT from the AFG.

Initially, when an AFG is setup with a specific cable and DUT, the measurements to de-embed the cable effect goes through two steps. First, a calibration is run, and second, the de-embedding of the cable effect for the various signals.

Figure 3:
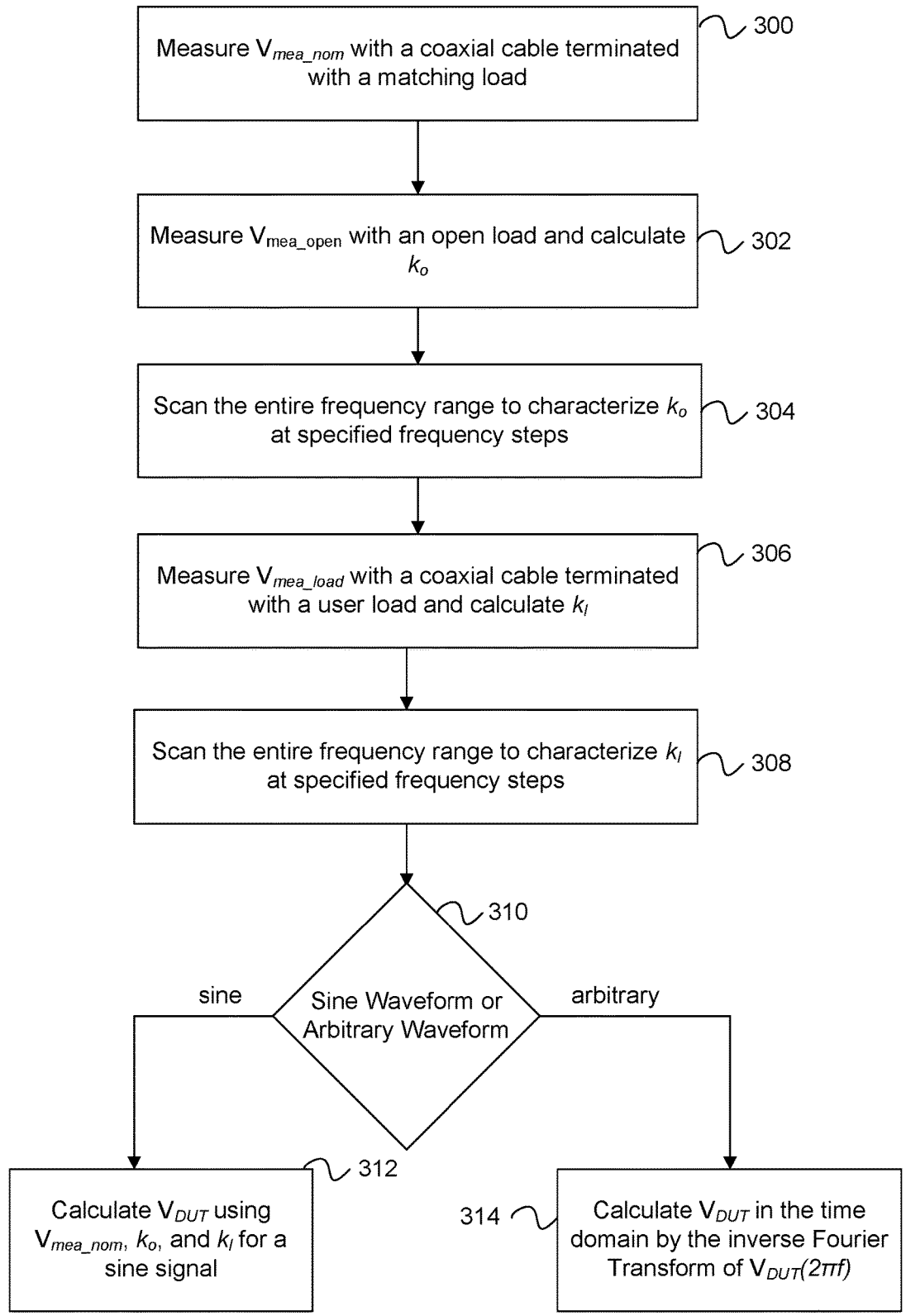
FIG. 3 illustrates a method for de-embedding the cable effect from an acquired waveform.

FIG. 3 depicts a method for de-embedding the cable effect according to some embodiments of the disclosed technology. The cable effect can be de-embedded from either a sine waveform or another type of waveform.

Initially, when the AFG is setup with a specific cable and DUT, a calibration is run. In operation 300, the voltage at the output 104 is measured for a sine signal of the frequency of f with a coaxial cable that is terminated with a matching load, i.e., with a load equal to the characteristic impedance $Z_C$ of the coaxial cable. This measurement provides the complex measurement result of the nominal output $V_{mea\_nom}$ of the AFG 200 through synchronous acquisition, i.e. $V_{mea\_nom}$ can be expressed in a complex format as shown in equation (1):

$$V_{mea\_nom} = \text{Abs}(V_{mea\_nom})e^{jAngle(V_{mea\_nom})} \quad (1)$$

where the synchronous trigger signal is used as a reference phase.

In operation 302, the voltage at the output 104 is measured for the sine signal of the frequency f with the coaxial cable terminated with an open load through synchronous acquisition, i.e., the signal is fully reflected by the load, which provides the measurement of $V_{mea\_open}$. This measurement may be used with $V_{mea\_nom}$ to determine the complex ratio $k_o$, as shown in equation (2):

$$k_o = \frac{V_{mea\_open}}{V_{mea\_nom}} = 1 + e^{-2l(\alpha+j\beta)} \quad (2)$$

where $\alpha$ is the unknown attenuation coefficient of the coaxial cable, $\beta$ the unknown waveform number of the coaxial cable, and l the unknown length of the coaxial cable.

Then in operation 304, the whole frequency range of the AFG 200 is scanned to characterize $k_o$ of coaxial cable with an open load at a specified frequency step of $\Delta f$, which is normally frequency-dependent. That is, $V_{mea\_nom}$ and $V_{mea\_open}$ are scanned over the entire frequency range at the specified frequency step. The data collections of $k_o(2\pi f)$ for multiple frequency points are needed for de-embedding non-sine wave signals because they occupy a frequency range rather than a single frequency point of a sine signal. These values are then stored in a coefficient table on a memory (not shown) of the AFG 200.

In operation 306, the voltage at the output 104 is measured for the sine signal of the frequency f with the coaxial cable terminated with a user load, i.e., the DUT to determine $V_{mea\_load}$. The complex ratio $k_l$ is calculated then using equation (3):

$$k_l = \frac{V_{mea\_load}}{V_{mea\_nom}} = 1 + e^{-2l(\alpha+j\beta)}\frac{Z_{DUT} - Z_C}{Z_{DUT} + Z_C} \quad (3)$$

where $Z_{DUT}$ is the unknown input impedance of DUT.

In operation 308, the whole frequency range of the AFG 200 is scanned to characterize $k_l$ at a specified frequency step of $\Delta f$, which is normally frequency-dependent. That is, $V_{mea\_load}$ is scanned over the entire frequency range at the specified frequency step. The data collections of $k_l(2\pi f)$ for multiple frequency points are needed for de-embedding non-sine wave signals because they occupy a frequency range rather than a single frequency point of sine signal. These values are then stored in a coefficient table on a memory (not shown) of the AFG 200.

After the values for $k_o$ and $k_l$ are stored in the coefficient table of the memory on the AFG, the AFG may then begin de-embedding for actual signals generated. That is, the AFG will first determine in step 310 whether a sine signal or an arbitrary signal is generated by the signal generation section 101.

In operation 312, if a sine signal is generated, then the coefficients $k_o$ and $k_l$ may be looked up at the user-set frequency point of signal generation to calculate the signal that is actually received at the DUT at the remote end of the coaxial cable, using equation (4):

$$V_{DUT} = \quad (4)$$
$$2V_{mea\_nom}\frac{Z_{DUT}}{Z_{DUT}+Z_C}e^{-l(\alpha+j\beta)} = V_{mea\_nom}\frac{k_o+k_l-2}{\sqrt{k_o-1}} = V_{mea\_nom}k_d$$

i.e., $V_{DUT}$ is de-embedded or retrieved from the measurement results at the output 104 of AFG 200 and $k_d$ is a de-embedding coefficient which is equal to $$\frac{k_o+k_l-2}{\sqrt{k_o-1}}.$$

In operation 314, if an arbitrary (non-sine) waveform signal is generated, the Fourier Transform of $V_{mea\_nom}$ of the time domain format is calculated to get $V_{mea\_nom}(2\pi f)$ of the frequency domain format and the measurement results may be computed in frequency domain to get $V_{DUT}(2\pi f)$. That is, the $k_o$ and $k_l$ coefficients at all frequency points over the frequency range are used. Then, the inverse Fourier Transform of $V_{DUT}(2\pi f)$ is calculated to get the actual waveform $V_{DUT}$ in time domain as seen in equation (5):

$$V_{DUT} = \quad (5)$$
$$\mathcal{F}^{-1}\{V_{DUT}(2\pi f)\} = \mathcal{F}^{-1}\left\{V_{mea\_nom}(2\pi f)\frac{k_o(2\pi f)+k_l(2\pi f)-2}{\sqrt{k_o(2\pi f)-1}}\right\} =$$
$$\mathcal{F}^{-1}\{V_{mea\_nom}(2\pi f)k_d(2\pi f)\}$$

i.e. $V_{DUT}$ is de-embedded or retrieved from the measurement result at the output 104 of AFG 200 to predict the actual waveform received at the DUT through the coaxial cable using the waveform de-embedding module 202 shown in FIG. 2.

Alternatively, it is feasible to use a well-designed pulse signal or arbitrary waveform signal to accelerate the above measurement process of frequency scanning. The procedure is almost the same except for calculating the Fourier Transform of $V_{mea\_nom}$, $V_{mea\_open}$ and $V_{mea\_load}$, $k_o$ and $k_l$ in frequency domain instead of repeating the calculations on the basis of frequency point by point while scanning the frequency range. It is noted here that this Pulse method helps to save the measurement time but at the cost of accuracy since it is more sensitive to noises.

Figure 4:
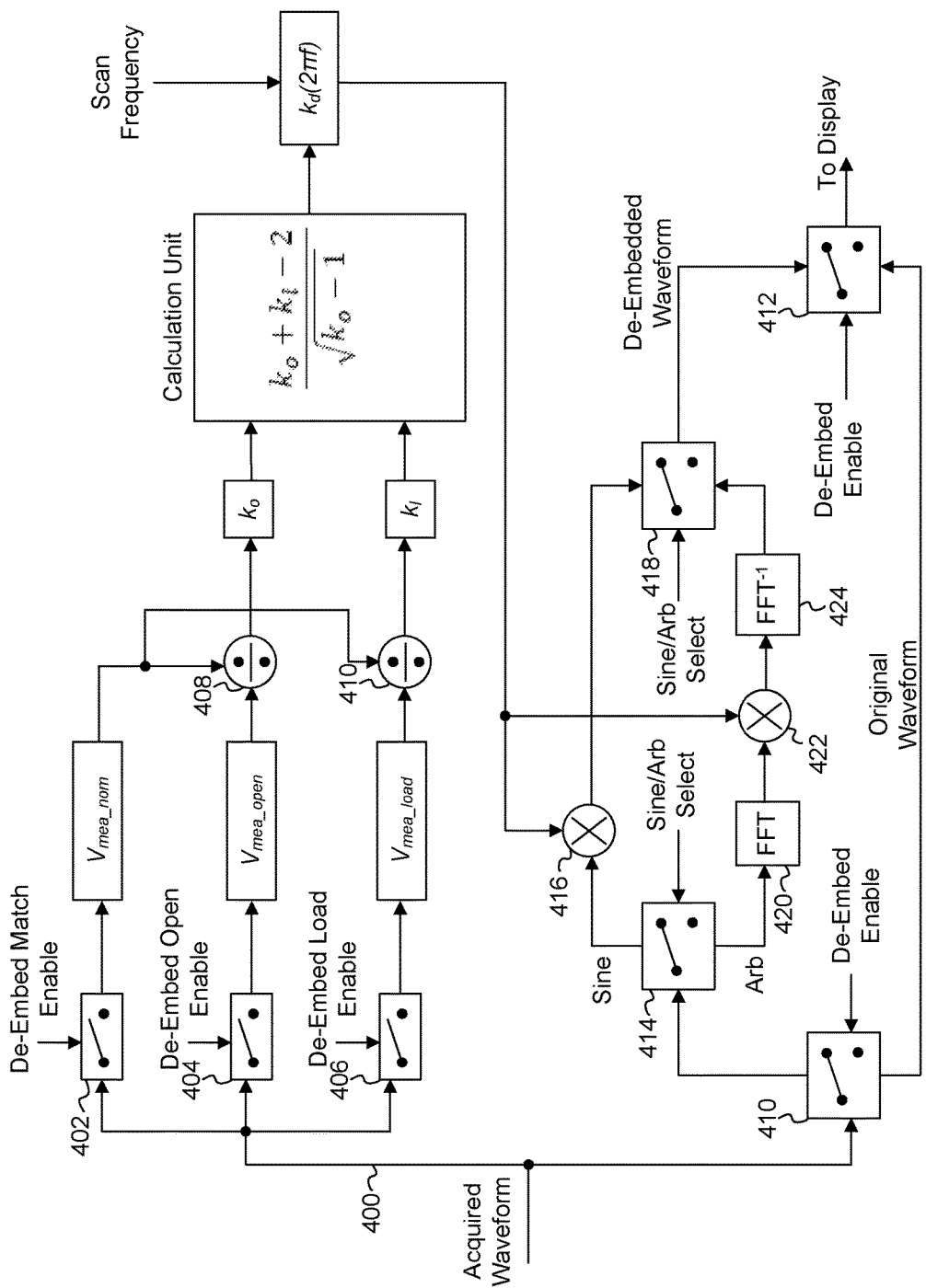
FIG. 4 illustrates a block diagram of a waveform de-embedding module of FIG. 2.

FIG. 4 depicts a block diagram of the De-Embedding module 202 shown in FIG. 2 with three separate paths. The first path measures $V_{mea\_nom}$, $V_{mea\_open}$, and $V_{mea\_load}$, as discussed above in operations 300, 302 and 306, using a sine wave of a single frequency. As seen in FIG. 4, the acquired waveform 400 is sent to a plurality of switches in the first path. The first switch 402, when enabled, measures $V_{mea\_nom}$ with a matched load using the acquired waveform, as discussed above in operation 300. The second switch 404, when enabled, measures $V_{mea\_open}$ with an open load using the acquired waveform, as discussed in operation 302. The third switch 406, when enabled, measures $V_{mea\_load}$ using the acquired waveform, with the coaxial cable terminated with a user load of DUT, as discussed in operation 306.

As in operations 302 and 306, $V_{mea\_open}$ is divided by $V_{mea\_nom}$ using divider 408, and $V_{mea\_load}$ is divided by $V_{mea\_nom}$ using divider 410, to calculate $k_o$ and $k_l$, respectively. The Waveform De-Embedding module 202 calculates $k_d$ using the equation $$\frac{k_o + k_l - 2}{\sqrt{k_o - 1}},$$

as discussed above in operation 312. This then provides the de-embedded coefficient at a single frequency.

However, as discussed above in operations 304 and 308, the whole frequency range is scanned to characterize $k_o$ and $k_l$ at specified frequency steps. The frequency scanning only needs to run a single time prior to waveform de-embedding for a specific setup of cable and DUT. This retrieves the frequency-dependent calibration/de-embedding function of $k_d(2\pi f)$ stored as a coefficient table, discussed above, in the system for later sine and arbitrary waveform monitoring/testing.

In the second path, if the de-embed switch 410 is enabled, the acquired waveform can be sent to the de-embedding calculation path through switch 414. For a sine signal, the signal goes to the multiplier 416 through the sine-selected switch 414 for amplitude scaling and phase offset for de-embedding at one single signal frequency and then goes through switches 418 and 412 to Waveform Display Controller (not shown) for display. For an arbitrary signal, the signal goes to FFT 420 for converting to the signal in frequency domain through the arbitrary-selected switch 414. Then the signal in the frequency domain format goes to the multiplier 422 for amplitude scaling and phase offset for de-embedding over the signal frequency range. And then the de-embedded signal in frequency domain goes to inverse FFT 424 for converting to the signal in time domain. Then the de-embedded signal in time domain goes through switches 418 and 412 to the Waveform Display Controller (not shown) for display.

In the final path, if the de-embed switch 410 is not enabled, then the acquired waveform can be sent to the Waveform Display Controller (not shown) for display through switch 412.

A de-embedding emulation example of the disclosed technology is shown below using an AFG having only a signal generation section and an oscilloscope.

First, a sine wave of 10 MHz, 1 Vpp, 50 Ohm termination for the AFG was set. The AFG's trigger out signal was used for triggering the oscilloscope's acquisition. A coaxial cable connected from the AFG to a termination of 50 Ohm. A high impedance probe with an oscilloscope channel was used to measure the voltage at the AFG's output, i.e. $V_{mea\_nom}$ (note: a test window was cut into the cable for the probe's contacting, which applies for the below discussed probe testing).

The cable was then disconnected to leave the cable as Open to measure the voltage at AFG output to determine $V_{mea\_open}$ through a high impedance probe with an oscilloscope channel. The cable was then connected to a DUT to measure the voltage at AFG output to determine $V_{mea\_load}$ and measure the actual voltage at DUT through a high impedance probe with an oscilloscope channel. Then, the de-embedded voltage at the AFG, i.e. $V_{DUT}$, was calculated using the above disclosed method of FIG. 3 and compared with the voltage actually measured at the DUT. This resulted in an amplitude error of less than 11% and a phase error of less than 3° for the de-embedded voltage waveform, versus the actual voltage waveform produced at the remote DUT location.

It may be concluded that the cable effect then can be de-embedded through the above disclosed technology without any knowledge of DUT and effectively make the waveform monitoring/testing virtually move to DUT from the instrument, which was called "Virtual Monitoring." Additionally, based on the above disclosed technology, it is feasible to enhance AFG to have the capability of compensation/pre-emphasis for improving output distortions for various DUTs. That is, an accurate depiction of the test signal received at the DUT based on the signal generated by the signal generation section 101 can be viewed by a user.

According to some examples, Waveform De-embedding Module 202 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A method for displaying waveforms expected to be received by a device under test on an arbitrary waveform and function generator, comprising:
generating a waveform by a waveform generation section of the arbitrary waveform and function generator;
sending, via an output of the arbitrary waveform and function generator, the generated waveform to the device under test through a cable that couples the output of the arbitrary waveform and function generator with the device under test;
measuring voltages of the generated waveform for a plurality of loads at the output of the arbitrary waveform and function generator via a waveform monitoring section of the arbitrary waveform and function generator;
determining by the waveform monitoring section a transformed waveform expected to be received at the device under test based on the measured voltages; and
outputting the transformed waveform to a display of the arbitrary waveform and function generator to enable a user to view the generated waveform as the generated waveform would be received by the device under test via the cable.

2. The method of claim 1, wherein measuring voltages of the generated waveform for a plurality of loads at the output includes:
measuring a first voltage for a specified frequency at the output with the cable terminated with a matching load to determine $V_{mea\_nom}$;
measuring a second voltage for the specified frequency at the output with the cable terminated with an open load to determine $V_{mea\_open}$; and
measuring a third voltage for the specified frequency at the output with the cable terminated with a load from the device under test to determine $V_{mea\_load}$; and
calculating $k_o$ and $k_l$ for the specified frequency, wherein $$k_o = \frac{V_{mea\_open}}{V_{mea\_nom}} \text{ and } k_l = \frac{V_{mea\_load}}{V_{mea\_nom}},$$

and wherein determining the transformed wavform is based on $k_o$ and $k_l$.

3. The method of claim 2, wherein determining the transformed waveform expected to be received at the device under test further comprises:
detecting that the generated waveform is a sine waveform, and wherein determining the transformed waveform further includes, in response to the detecting, calculating the transformed waveform expected to be received at the device under test $V_{DUT}$ based on the equation:

$$V_{DUT} = V_{mea\_nom} \frac{k_o + k_l - 2}{\sqrt{k_o - 1}}.$$

4. The method of claim 2, wherein measuring voltages of the generated waveform for a plurality of loads further includes:

scanning an entire frequency range of the arbitrary function and waveform generator at specified steps;
measuring $V_{mea\_nom}$, $V_{mea\_open}$, and $V_{mea\_load}$ at each specified frequency step; and
calculating $k_o$ and $k_l$ for each specified frequency step to calculate $k_o(2\pi f)$ and $k_l(2\pi f)$.

5. The method of claim 4, wherein determining the transformed waveform expected to be received at the device under test further comprises:
detecting that the generated waveform is a non-sine waveform, and wherein determining the transformed waveform further includes, in response to the detecting, calculating the transformed waveform expected to be received at the device under test $V_{DUT}$ based on the equation:

$$V_{DUT} = \mathcal{F}^{-1}\left\{V_{mea\_nom}(2\pi f)\frac{k_o(2\pi f) + k_l(2\pi f) - 2}{\sqrt{k_o(2\pi f) - 1}}\right\},$$

wherein $k_o = \frac{V_{mea\_open}}{V_{mea\_nom}}$ and $k_l = \frac{V_{mea\_load}}{V_{mea\_nom}}$.

6. The method of claim 1, wherein actual waveforms received by the device under test are unknown.

7. The method of claim 1, wherein a phase delay and an attenuation of the cable are unknown.

8. An arbitrary waveform and function generator, comprising:
a display;
an output;
a waveform generation section, coupled with the output, configured to generate a waveform; and
a waveform monitoring section, coupled with the output and the display, configured to monitor the generated waveform at the output, the waveform monitoring section including:
a processor configured to:
measure voltages of the generated waveform for a plurality of loads at the output,
determine a transformed waveform expected to be received at the device under test based on the measured voltages, and
output the transformed waveform to the display to enable a user to view the generated waveform as the generated waveform would be received by the device under test via a cable that couples the arbitrary waveform and function generator to the device under test.

9. The arbitrary waveform and function generator of claim 8, wherein to measure voltages of the generated waveform for the plurality of loads the waveform monitoring section is further configured to:
measure a first voltage for a specified frequency at the output with the cable terminated with a matching load to determine $V_{mea\_nom}$;
measure a second voltage for the specified frequency at the output with the cable terminated with an open load to determine $V_{mea\_open}$; and
measure a third voltage for the specified frequency at the output with the cable terminated with a load from the device under test to determine $V_{mea\_load}$; and
calculate $k_o$ and $k_l$ at the specified frequency, wherein $$k_o = \frac{V_{mea\_open}}{V_{mea\_nom}} \text{ and } k_l = \frac{V_{mea\_load}}{V_{mea\_nom}}.$$

10. The arbitrary waveform and function generator of claim 9, wherein the processor is further configured to: detect that the generated waveform is a sine waveform, and wherein to determine the transformed waveform expected to be received at the device under test $V_{DUT}$ is based on the equation:

$$V_{DUT} = V_{mea\_nom} \frac{k_o + k_l - 2}{\sqrt{k_o - 1}}.$$

11. The arbitrary waveform and function generator of claim 9, wherein the waveform monitoring section is further configured to:
scan an entire frequency range of the arbitrary function and waveform generator at specified steps;
measure $V_{mea\_nom}$, $V_{mea\_open}$, and $V_{mea\_load}$ at each specified frequency step; and
calculate $k_o$ and $k_l$ for each specified frequency step to calculate $k_o(2\pi f)$ and $k_l(2\pi f)$.

12. The arbitrary function and waveform generator of claim 11, wherein the processor is further configured to: detect that the generated waveform is a non-sine waveform, and wherein to determine the transformed waveform further includes, in response to the detection, calculation of the transformed waveform expected to be received at the device under test $V_{DUT}$ based on the equation:

$$V_{DUT} = \mathcal{F}^{-1}\left\{V_{mea\_nom}(2\pi f)\frac{k_o(2\pi f) + k_l(2\pi f) - 2}{\sqrt{k_o(2\pi f) - 1}}\right\},$$

wherein $k_o = \frac{V_{mea\_open}}{V_{mea\_nom}}$ and $k_l = \frac{V_{mea\_load}}{V_{mea\_nom}}$.

13. The arbitrary waveform and function generator of claim 8, wherein actual waveforms received by the device under test are unknown.

14. The arbitrary waveform and function generator of claim 8, wherein a phase delay and an attenuation of the cable are unknown.

15. One or more non-transitory computer-readable media having instructions embodied thereon, which, when executed by a processor of an arbitrary waveform and function generator, cause the arbitrary waveform and function generator to:
generate a waveform;
send the generated waveform to a device under test through a cable that couples an output of the arbitrary waveform and function generator with the device under test;
measure voltages of the generated waveform for a plurality of loads at the output of the arbitrary waveform and function generator;
determine a transformed waveform expected to be received at the device under test based on the measured voltages; and
output the transformed waveform to a display of the arbitrary waveform and function generator to enable a user to view the generated waveform as the generated waveform would be received by the device under test via the cable.

16. The one or more non-transitory computer-readable media of claim 15, wherein to measure voltages of the generated waveform for a plurality of loads at the output the instructions cause the arbitrary waveform and function generator to:
measure a first voltage for a specified frequency at the output with the cable terminated with a matching load to determine $V_{mea\_nom}$;
measure a second voltage for the specified frequency at the output with the cable terminated with an open load to determine $V_{mea\_open}$; and
measure a third voltage for the specified frequency at the output with the cable terminated with a load from the device under test to determine $V_{mea\_load}$; and
calculate $k_o$ and $k_l$ for the specified frequency, wherein $$k_o = \frac{V_{mea\_open}}{V_{mea\_nom}} \text{ and } k_l = \frac{V_{mea\_load}}{V_{mea\_nom}},$$

and wherein determining the transformed wavform is based on $k_o$ and $k_l$.

17. The one or more non-transitory computer-readable media of claim 16, wherein to determine the transformed waveform expected to be received at the device under test the instructions further cause the arbitrary waveform and function generator to:
detect that the generated waveform is a sine waveform, and wherein to determine the transformed waveform further includes, in response to the detection, calculation of the transformed waveform expected to be received at the device under test $V_{DUT}$ based on the equation:

$$V_{DUT} = V_{mea\_nom} \frac{k_o + k_l - 2}{\sqrt{k_o - 1}}.$$

18. The one or more non-transitory computer-readable media of claim 16, wherein to measure voltages of the generated waveform for a plurality of loads the instructions cause the arbitrary waveform and function generator to:
scan an entire frequency range of the arbitrary function and waveform generator at specified frequency steps;
measure $V_{mea\_nom}$, $V_{mea\_open}$, and $V_{mea\_load}$ at each specified frequency step; and
calculate $k_o$ and $k_l$ for each specified frequency step to calculate $k_o(2\pi f)$ and $k_l(2\pi f)$.

19. The one or more non-transitory computer-readable media of claim 18, wherein to determine the transformed waveform expected to be received at the device under test, the instructions cause the arbitrary waveform and function generator to:
detect that the generated waveform is a non-sine waveform, and wherein to determine the transformed waveform further includes, in response to the detection, calculation of the transformed waveform expected to be received at the device under test $V_{DUT}$ based on the equation:

$$V_{DUT} = \mathcal{F}^{-1}\left\{V_{mea\_nom}(2\pi f)\frac{k_o(2\pi f) + k_l(2\pi f) - 2}{\sqrt{k_o(2\pi f) - 1}}\right\},$$

-continued wherein $k_o = \frac{V_{mea\_open}}{V_{mea\_nom}}$ and $k_l = \frac{V_{mea\_load}}{V_{mea\_nom}}$.

20. The one or more non-transitory computer-readable media of claim 15, wherein:
actual waveforms received by the device under test are unknown and/or
a phase delay and an attenuation of the cable are unknown.

\* \* \* \* \*